(12) United States Patent
Suzuki et al.

(10) Patent No.: US 8,421,757 B2
(45) Date of Patent: Apr. 16, 2013

(54) TOUCH SENSOR WITH A PLURALITY OF TOUCH SENSOR SECTIONS

(75) Inventors: Hiroyuki Suzuki, Kanagawa (JP); Toshifumi Nomura, Kanagawa (JP)

(73) Assignee: Sony Corporation, Tokyo (JP)

( * ) Notice: Subject to any disclaimer, the term of this patent is extended or adjusted under 35 U.S.C. 154(b) by 641 days.

(21) Appl. No.: 12/249,138

(22) Filed: Oct. 10, 2008

(65) Prior Publication Data

US 2009/0101417 A1    Apr. 23, 2009

(30) Foreign Application Priority Data

Oct. 12, 2007  (JP) .................................. 2007-266748
Oct. 9, 2008   (JP) .................................. 2008-263021

(51) Int. Cl.
    *G06F 3/041*    (2006.01)
(52) U.S. Cl.
    USPC ....................................... 345/173; 178/18.06

(58) Field of Classification Search ............... 178/18.01, 178/18.03, 18.06; 345/173, 174; 200/600; 324/658
See application file for complete search history.

(56) References Cited

U.S. PATENT DOCUMENTS

| | | | |
|---|---|---|---|
| 2004/0238726 A1* | 12/2004 | Caldwell | 250/221 |
| 2006/0202971 A1* | 9/2006 | Kaliher | 345/173 |
| 2006/0227119 A1* | 10/2006 | Hsieh et al. | 345/173 |
| 2008/0088592 A1* | 4/2008 | Fry | 345/173 |
| 2008/0088600 A1* | 4/2008 | Prest et al. | 345/173 |
| 2009/0174679 A1* | 7/2009 | Westerman | 345/173 |

* cited by examiner

*Primary Examiner* — Chanh Nguyen
*Assistant Examiner* — Pegeman Karimi
(74) *Attorney, Agent, or Firm* — Frommer Lawrence & Haug LLP; William S. Frommer

(57) ABSTRACT

A touch sensor includes: a first touch sensor section; a second touch sensor section disposed close to the first touch sensor; and a sensor detection section detecting whether a valid touch has been given to the first touch sensor section on the basis of an output of the second touch sensor section.

7 Claims, 5 Drawing Sheets

TOUCH SENSOR WITH A PLURALITY OF TOUCH SENSOR SECTIONS

CROSS REFERENCES TO RELATED APPLICATIONS

The present invention contains subject matter related to Japanese Patent Applications JP 2007-266748 and JP 2008-263021 filed in the Japanese Patent Office on Oct. 12, 2007 and Oct. 9, 2008, the entire contents of which are incorporated herein by reference.

BACKGROUND OF THE INVENTION

1. Field of the Invention

The present invention relates to a touch sensor capable of determining whether a valid touch has been given by a finger, or the like.

2. Description of the Related Art

Touch sensors are roughly divided into electric sensors using a change in impedance, such as capacitance, resistance, etc., optical-coupling sensors, mechanical sensors, and the like.

Among electric sensors, capacitive sensors using capacitance, in particular, allows detecting a touch even with a small touch pressure. At the same time, the capacitive sensors are highly sensitive, and thus react on a touch by an object or an unintended human body to perform detection.

In order not to detect a touch when an object is placed on a touch sensor, or in order to prevent an unintended touch by a human body, there is a method of providing an operation face 101 of a touch sensor at a position lower than a surface 100 as shown in FIG. 5A.

For example, a description has been given of a capacitive control member, which is a touch sensor of a capacitive type, an optical-coupling type, etc., in Japanese Unexamined Patent Application Publication No. 2004-006315. The description includes a support structure made of a hard material, which is difficult to be elastically deformed, is provided with a through hole having a size corresponding to a human finger. The through hole is covered with an elastic cover, and a touch-sensor operation section (in the case of a capacitor, an electrode, etc., thereof) is disposed at a predetermined position just under the through hole.

This sensor structure is devised with the intention of knowing the position of the operation section (touch section) of the touch sensor without seeing in the following circumstances. For example, the sensor is used for a touch sensor, etc., on the operation panel of an in-vehicle unit using the difference between touch feeling when tracing by a finger on the elastic cover of the hard support structure and touch feeling when tracing by a finger on the portion of only the elastic cover at the edge and the inside of the through hole.

However, in the case of the sensor structure described in Japanese Unexamined Patent Application Publication No. 2004-006315, even if an object is placed on the sensor, the sensor does not detect it. Also, if the sensor is unintentionally touched by a part other than a human finger, for example, a palm of a human hand or by an arm, the sensor does not detect it.

Thus, the sensor structure described in Japanese Unexamined Patent Application Publication No. 2004-006315 has an advantage for preventing an unintentional touch by an object and a person and for detecting only a valid touch.

In particular, in order to prevent an unintended touch by an object, it is possible to substantially achieve the prevention by inclining a sensor operation face 102 to such a degree not allowing to place an object as shown in FIG. 5B.

SUMMARY OF THE INVENTION

However, in a sensor structure in which an operation section of a touch sensor is formed in a recessed position from a hard surface, as shown in FIG. 5A, such as a technique described in Japanese Unexamined Patent Application Publication No. 2004-006315, the cost of the sensor sometimes becomes high because of its structure.

Also, this sensor structure is not suitable for an application in which a touch sensor is embedded in part of a display panel surface, for example.

Further, the touch face of the touch sensor is recessed below the panel surface, and thus a touch is not detected unless pressed with a relatively strong force. Accordingly, it is difficult to make the best use of high sensitivity of the sensor. Also, there is a drawback in that the touch pressure varies depending on the size of a human finger.

On the other hand, the touch sensor shown in FIG. 5B has an advantage in that an object is not placed on the touch sensor, but has a restriction of the need to be inclined in the design.

Also, it is not possible to prevent an unintended touch by a part of a human body other than a finger or an object.

It is desirable to provide an electric touch sensor which prevents a miss-operation caused by an unintended touch by an object or a person.

According to an embodiment of the present invention, there is provided a touch sensor including: a first touch sensor section; a second touch sensor section disposed close to the first touch sensor; and a sensor detection section detecting whether a valid touch has been given to the first touch sensor section on the basis of an output of the second touch sensor section.

By the above-described embodiment, the sensor detection section constantly inputs (or monitors) the output (including a state) of the first touch sensor section and the output of the second touch sensor section. The sensor detection section detects whether the first touch sensor section is validly operated (touched). The sensor detection section determines whether the detection is valid or invalid on the basis of the output of the second touch sensor section. Thus, at the time of unintended touch by an object or a part of a human body, the sensor detection section invalidates the output (touch detection) of the first touch sensor section, and validates only an intended touch.

When a touch sensor having this configuration is installed in an apparatus, the apparatus can detect an invalid touch. Thus, it is possible to give a caution or a warning from informing means disposed in the apparatus.

In a touch sensor according to the embodiment of the present invention, when the sensor detection section detects a touch on the first touch sensor section, the sensor detection section may validate the touch detection on the condition that the second touch sensor does not detect a valid touch, and when the sensor detection section detects a touch on the second touch sensor section, the sensor detection section may invalidate the touch detection on the first touch sensor section.

In a touch sensor according to the embodiment, the sensor detection section is preferably capable of detecting a touch level indicating a degree of touch on each of the first touch sensor section and the second touch sensor section, when a first touch level on the first touch sensor section and a second touch level on the second touch sensor section are both within a range regarded as valid, if the first touch level is out of the range and the second touch level is within the range, or if both the first touch level and the second touch level are out of the range, the sensor detection section invalidates the touch detection on the first touch sensor section, and if the first touch level is within the range and the second touch level is out of the range, the sensor detection section validates the touch detection on the first touch sensor section.

By the above-described embodiment, it is possible to easily and correctly determine whether a touch is valid or invalid on the basis of the strength of the touch pressure additionally.

The present invention is preferably applied to an electric type sensor in which impedance, such as capacitance or resistance, changes in accordance with the touch level.

Thus, in a touch sensor according to the embodiment of the present invention, the first touch sensor section and the second touch sensor section are preferably capacitive touch sensors changing capacitance by an approach or a touch of a human body or an object.

Also, in a touch sensor according to the embodiment of the present invention, the first touch sensor section and the second touch sensor section are preferably capacitive touch sensors changing capacitance by an approach or a touch of a human body or an object, and in accordance with an amount of change in capacitance of the first touch sensor section and an amount of change in capacitance of the second touch sensor section, the sensor detection section may determine whether each of the two amounts of change in capacitance is within the range or out of the range.

By the above-described touch sensor of the embodiment, the touch sensor is a capacitive type, and thus it is possible to detect a degree of touch correctly. This makes it easier to determine whether or not a touch is within a valid range.

In a touch sensor according to the embodiment of the present invention, an operation section of the second touch sensor section is preferably disposed closed to the periphery of an operation section of the first touch sensor section.

Also, in a touch sensor according to the embodiment of the present invention, the first touch sensor section and the second touch sensor section are preferably capacitive touch sensors changing capacitance by an approach or a touch of a human body or an object, and a second electrode corresponding to the operation section of the second touch sensor section is preferably disposed close to the periphery of a first electrode corresponding to the operation section of the first touch sensor section.

In the touch sensor according to the above-described embodiment, the operation section of the second touch sensor section is disposed close to the periphery of an operation section of the first touch sensor section. Thus, the second touch sensor section easily detects an unintended operation of the first touch sensor section.

For example, in the case where a valid touch has been given by part of a human body having a limited area, such as a finger, etc., it is possible to roughly estimate whether the touch is intended or not depending on whether the first touch sensor section is properly touched by a finger. If the operation section of the second touch sensor section is disposed apart from the operation section of the first touch sensor section, it is difficult to know whether the touch is intended or not, because the first touch sensor section constantly detects a touch, and the second touch sensor section does not detect the touch. In contrast, if the second touch sensor section is disposed (appropriately) close to the periphery of an operation section of the first touch sensor section, only the first touch sensor section detects a touch only at the time when the first touch sensor section is properly touched by a finger, and thus at the time of the touch being regarded as intentional. In this case, if a touch is not intended, the probability of giving a touch on the operation section of the second touch sensor section increases, and thus, it becomes possible to detect an unintended touch, and to give a warning, etc.

In this regard, in the above-described embodiments, the disposition shape of the operation section is not limited.

Accordingly, for example, the operation section of the second touch sensor section may be dividedly disposed at the periphery of the first touch sensor section. If a touch on all of the divided parts is detected, it is determined that "an object is placed" or "there is a touch by part of a human body having a large area". If a touch on a portion of the divided parts is detected, it is determined to be "miss-operation" or "a touch by part of a human body having a small area". Thus, it is possible to react differently, for example, by giving a warning with a content in accordance with the determination result. In this case, it is possible to distinguish an incident of "an object is placed" in particular by taking a touch time into consideration.

By the present invention, it is possible to provide an electric touch sensor which prevents miss-operation by an unintended touch by an object and a person.

DESCRIPTION OF THE PREFERRED EMBODIMENTS

In the following, a description will be given of an embodiment of the present invention by taking a capacitive touch sensor as an example. The description will be given in the following sequence with reference to the drawings.

Figure 1A:
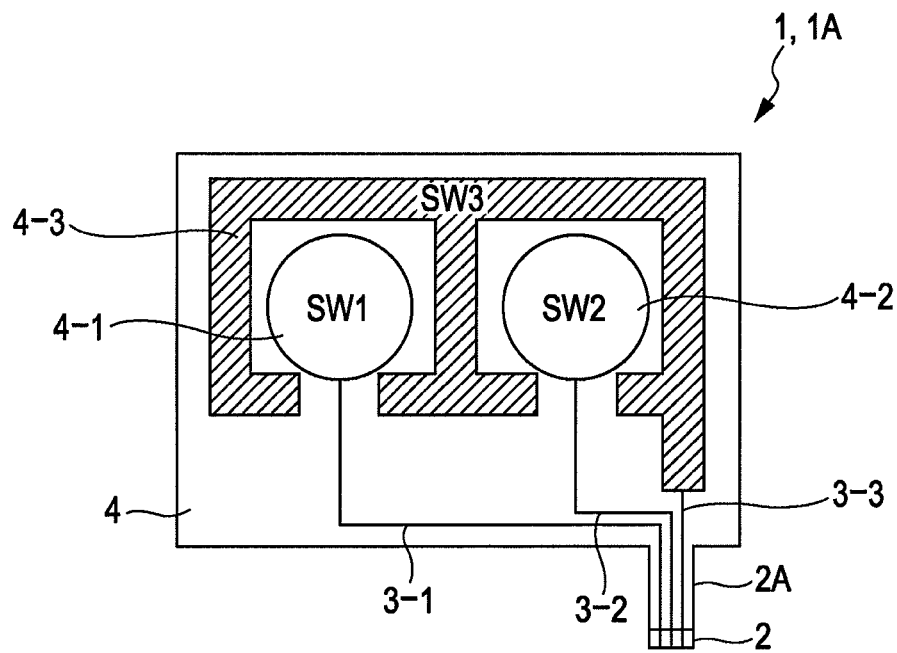
FIG. 1A illustrates a touch panel block of a touch sensor according to an embodiment of the present invention.
Figure 1B:
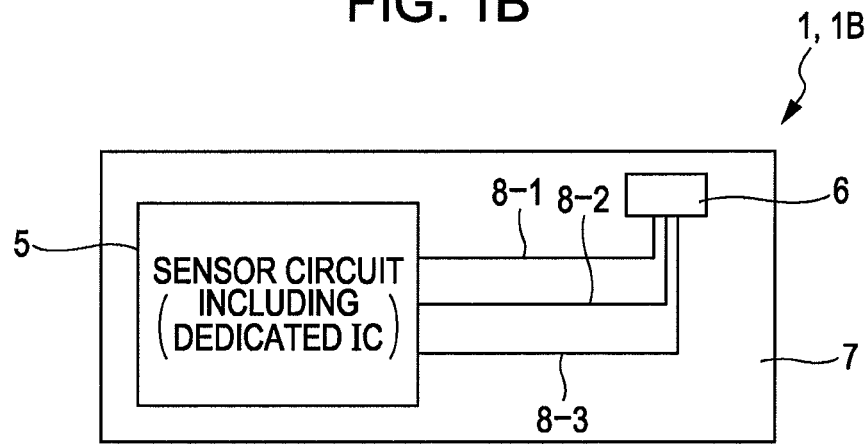
FIG. 1B illustrates a control block of the touch sensor according to the embodiment of the present invention.
Figure 2:
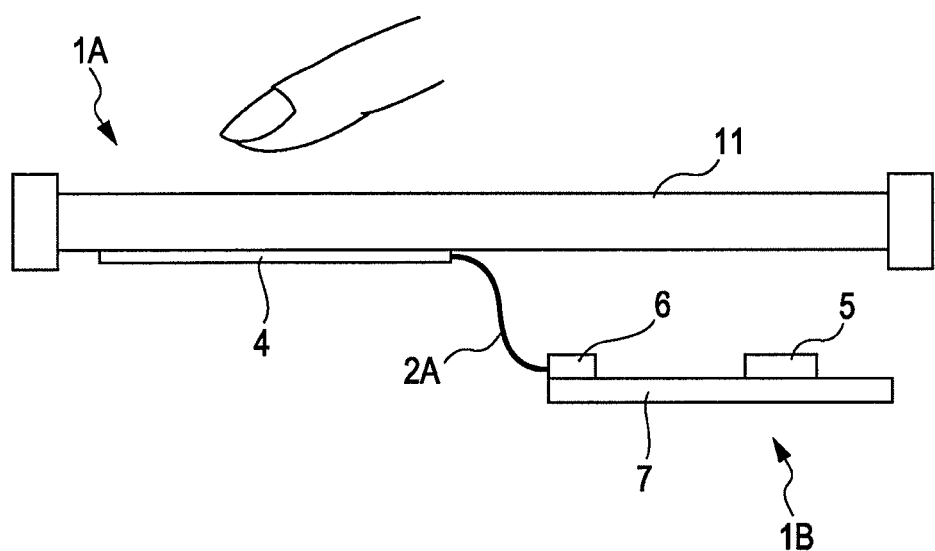
FIG. 2 is a schematic side view of a structure of a capacitor according to the embodiment of the present invention.
Figure 3:
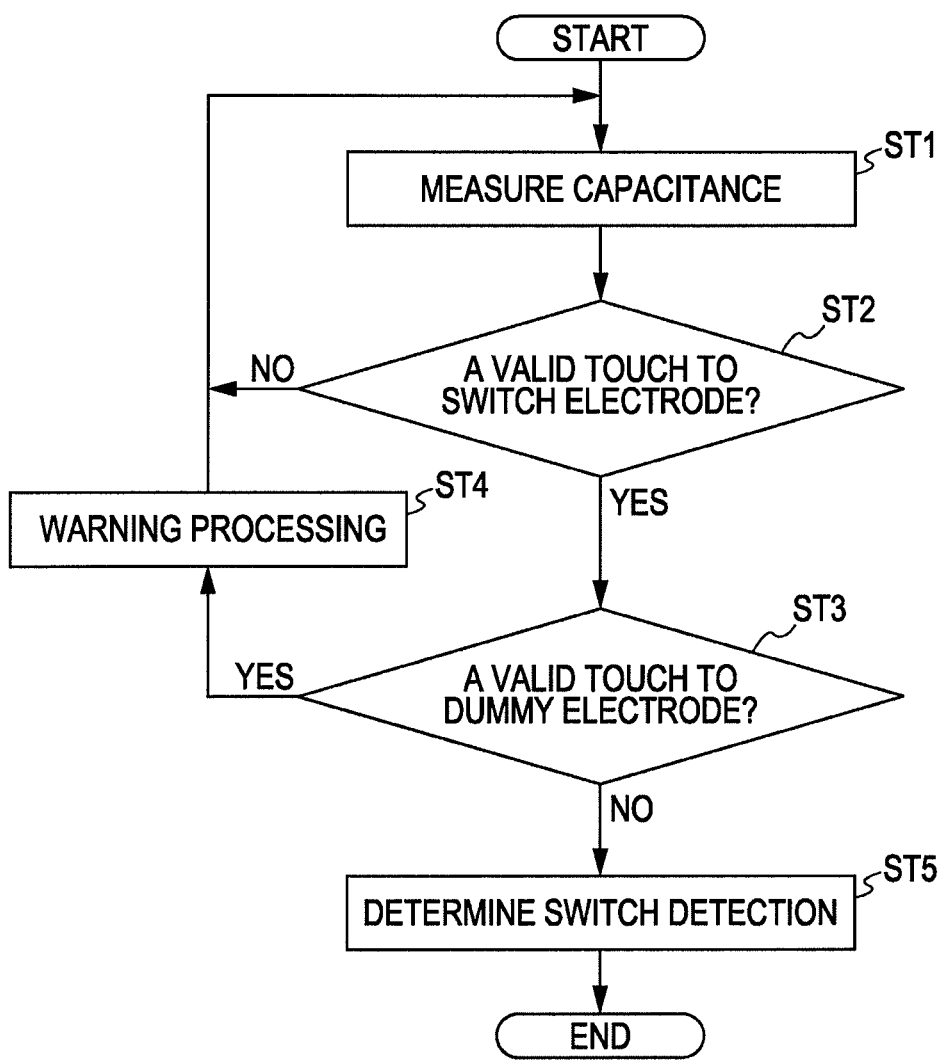
FIG. 3 is a flowchart illustrating processing determination steps of a detection operation according to the embodiment of the present invention.

1. Configuration of Touch Sensor: FIGS. 1 and 2
2. Example of Detection Operation: FIG. 3 (ST4→FIG. 4)
3. Variation 1. Configuration of Touch Sensor FIG. 1A and FIG. 1B illustrate a touch panel block 1A and a control block 1B of a touch sensor 1, respectively. Also, FIG. 2 illustrates a schematic side view of a capacitive structure.

In FIG. 1A, the touch panel block 1A includes two switches SW1 and SW2 as "the first touch sensor section" and one switch SW3 disposed as "the second touch sensor section" in the vicinity of, and common to the two switches SW1 and SW2. The switches SW1 and SW2 are switches to be operated intentionally, and thus are called "operation switches". On the other hand, the switch SW3 is a switch to be used for determining whether the operation of the operation switches SW1 and SW2 is valid or not. The switch SW3 may be operated unintentionally, is not to be operated for itself, and thus is called as a "dummy switch" below.

FIG. 1A shows a switch-electrode pattern made of a transparent electrode material, such as ITO (Indium Tin Oxide), etc., and three wiring lines 3-1 to 3-3 for connecting the electrodes to a connector connection section 2. The wiring lines 3-1 to 3-3 are illustrated by lines in FIG. 1A, but are actually configured by a pattern of three lines (wiring lines) made of a silver paste material, for example.

In FIG. 1A, an electrode (switch electrode 4-1) of the operation switch SW1 and an electrode (switch electrode 4-2) of the operation switch SW2 are disposed at a predetermined distance or more apart from each other. The switch electrodes 4-1 and 4-2 may be shaped in another pattern (for example, rectangular). Here, the switch electrodes 4-1 and 4-2 are shaped in a pattern assumed to be operated by a finger. For example, each of the switch electrodes 4-1 and 4-2 is shaped in a circular pattern having a diameter of one size larger than the size of an index finger. The distance between the switch electrodes 4-1 and 4-2 needs to be large enough such that when one of the switch electrodes is operated, the other switch electrode is not operated mistakenly. Both electrodes are disposed at that distance or more apart.

The switch electrodes 4-1 and 4-2, and the dummy electrode 4-3 correspond to "the first and the second touch sensor sections".

The dummy electrode 4-3 is disposed close to the periphery of the switch electrodes 4-1 and 4-2, and, for example as shown in FIG. 1A, is substantially ring-shaped, which is partly cutaway from completely closed ring-shaped. More specifically, the dummy electrode 4-3 is disposed so as to surround each of the periphery of the switch electrodes 4-1 and 4-2, and has two openings, which are individually cut off partly at the side of the connector connection section 2. The wiring line 3-1 is disposed in order to connect the switch electrode 4-1 and one of the terminals of the connector connection section 2 through one of the two openings. In the same manner, the wiring line 3-2 is disposed in order to connect the switch electrode 4-2 and the other of the terminals of the connector connection section 2 through the other of the openings. Also, one terminal of the dummy electrode 4-3 is connected to the other one terminal of the connector connection section 2 through the wiring line 3-3.

The switch electrodes 4-1 and 4-2 and the dummy electrode 4-3 are formed by cutting one (ITO) electrode film 4 into patterns in a state of being insulated from one another.

At the same time, in the control block 1B shown in FIG. 1B, a sensor circuit 5 as a "sensor detection section" and a connector 6 are mounted on a printed circuit board 7. On the printed circuit board 7, three wiring lines 8-1 to 8-3 are formed by a conductive pattern in order to connect input of the sensor circuit 5 and a connector 6. When the connector connection section 2 in FIG. 1A is inserted into the connector 6 in FIG. 1B, the wiring line 8-1 is connected to the wiring line 3-1, the wiring line 8-2 is connected to the wiring line 3-2, and the wiring line 8-3 is connected to the wiring line 3-3.

The sensor circuit 5 is a circuit for detecting whether a valid touch is given to the operation switches SW1 and SW2 as the "first touch sensor section" on the basis of the output of the dummy switch SW3 as the "second touch sensor section".

More specifically, when the sensor circuit 5 detects a touch on the operation switches SW1, SW2, the sensor circuit 5 preferably validates the touch detection on the operation switches SW1, SW2 on the condition that the valid touch on the dummy switch SW3 has not been detected. On the other hand, when the sensor circuit 5 detects a touch on the dummy switch SW3, the sensor circuit 5 may invalidate the touch detection on the operation switches SW1, SW2. A detailed description will be given later on the contents of such an example of the detection operation.

The sensor circuit 5 may be a dedicated IC itself, or may be included as one function of another IC. Also, the same function as that of the sensor circuit 5 may be implemented by software performed by a microcomputer, etc. In this case, the "sensor detection section" is achieved as a task of the software execution program, and hardware executing the task.

In the structure of the capacitor shown in FIG. 2, the touch panel block 1A shown in FIG. 1A is connected to the control block 1B shown in FIG. 1B at the position on which the connector connection section 2 is disposed.

As shown in FIG. 2, the (ITO) electrode film 4 is formed on the backside of a non-conductive panel 11, which is formed by a non-conductive material, such as acrylic, glass, etc., and which also serves for a protection layer by bonding using transparent adhesive. The switch electrodes 4-1 and 4-2, and the dummy electrode 4-3 are formed by one sheet of the electrode film 4.

In this regard, "the first touch sensor section" includes a part corresponding to the switch electrodes 4-1 and 4-2 of the non-conductive panel 11. Also, "the second touch sensor section" includes a part corresponding to the dummy electrode 4-3 of the non-conductive panel 11.

Thus, "a touch is given to the first touch sensor section" means that a touch is given to the part corresponding to the switch electrodes 4-1 and 4-2 of the non-conductive panel 11. Also, "coming close to the first touch sensor section" means coming close to the part corresponding to the switch electrodes 4-1 and 4-2 of the non-conductive panel 11.

In the same manner, "a touch is given to the second touch sensor section" means that a touch is given to the part corresponding to the dummy electrode 4-3 of the non-conductive panel 11. Also, "coming close to the second touch sensor section" means coming close to the part corresponding to the dummy electrode 4-3 of the non-conductive panel 11.

The wiring lines 3-1 to 3-3, to which the switch electrodes 4-1 and 4-2 and the dummy electrode 4-3 that are formed from the one electrode film 4 are individually connected, and are connected to the three sensor inputs of the sensor circuit 5 (FIG. 1B), which is not shown in FIG. 2, through the connector 6 and the wiring lines 8-1 to 8-3.

In this regard, in FIG. 2, when each of the operation sections (the switch electrodes 4-1 and 4-2, and the dummy electrode 4-3) on the non-conductive panel 11 is touched by a finger, etc., a change occurs in capacitance of the switch electrodes 4-1 and 4-2, and the dummy electrode 4-3. This change in capacitance sometimes occurs when a finger, etc., comes close to each operation section of the non-conductive panel 11. This change in capacitance is input into the sensor circuit 5 through three independent paths.

Accordingly, the sensor circuit 5 can detect whether a valid contact has been given on the operation switches SW1 or SW2 (the first touch sensor) on the basis of the output of the dummy switch SW3 (the second touch sensor). A description will be given of an example of a "valid touch" in the following detection operation.

2. Example of Detection Operation

FIG. 3 illustrates, by flowchart, processing determination steps performed by control means (a CPU) in the sensor circuit 5 in the example of the detection operation. In the description of FIG. 3, FIG. 1A to FIG. 2 are appropriately referenced.

In step ST1, the sensor circuit 5 constantly performs measuring the above-described three capacitance values.

When the sensor circuit 5 detects that there is a change in the three capacitance values, the sensor circuit 5 performs determination of the next steps ST2 and ST3 depending on which capacitance has changed.

More specifically, first, in step ST2, a determination is made on which position of the switch electrodes 4-1 and 4-2, a valid touch on the panel face has been given. That is to say, if any touch has been given on the panel face over the switch electrode 4-1, and if a change in capacitance by the touch is, for example a predetermined value or more, the touch to the switch electrode 4-1 is determined to be valid. In the similar manner, if any touch has been given on the panel face over the switch electrode 4-2, and if a change in capacitance by the touch is, for example a predetermined value or more, the touch to the switch electrode 4-2 is determined to be valid. The sensor circuit 5 determines whether the touch on the switch electrodes is valid.

In step ST3, a determination is made on whether there is "a valid touch to the dummy electrode". That is to say, if any touch has been given on the panel face over the switch electrode 4-3, and if a change in capacitance by the touch is, for example, a predetermined value or more, the touch to the switch electrode 4-3 is determined to be valid. The sensor circuit 5 determines this.

Here, it is possible to determine that a valid touch has been given to the electrode when an external capacitor, such as a finger, etc., works on the electrode, a change occurs in the holding capacitance value (capacitance value) of the capacitor, and the change can be discriminated from a noise level. The discrimination from the noise level is not limited to the above-described method of using a predetermined value.

In step ST2, if "a valid touch to the switch electrode" is not detected, the processing returns to before step ST1, and a change in capacitance is continued to be waited.

In step ST2, if a valid touch to the switch electrodes 4-1, 4-2 has been detected, a determination is made on whether there is "a valid touch to the dummy electrode" in the next step ST3. Here, if a valid touch on the dummy electrode 4-3 has been detected, the touch on the switch electrodes 4-1, 4-2, which has been detected in step ST2, is invalidated, warning processing is performed in step ST4, and then the processing returns to before step ST1.

On the other hand, in step ST3, if "the dummy electrode is on" is not detected, the touch on the switch electrodes 4-1, 4-2, which has been detected in step ST2, is validated, a determination is made on this in the next step ST5, and the processing is terminated. After the processing is terminated, the processing of step ST1 is restarted, and after that, the same processing is performed.

Figure 4:
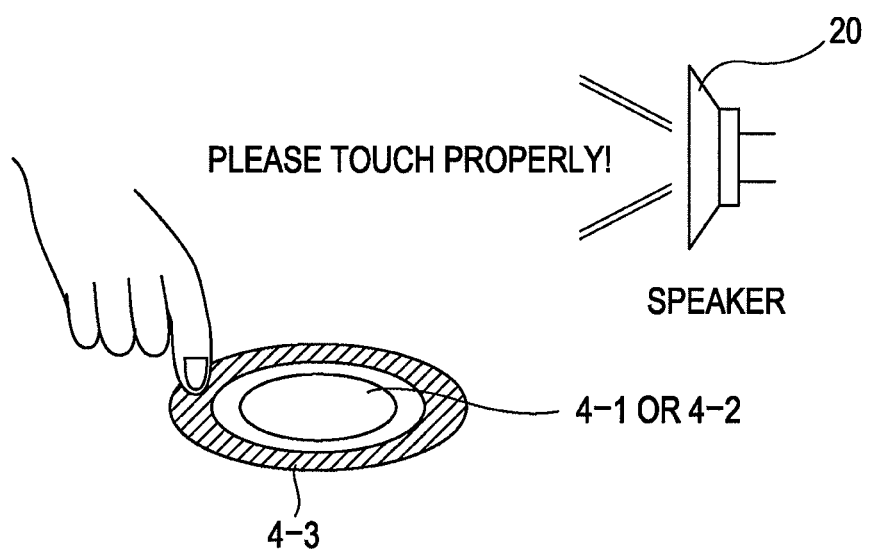
FIG. 4 illustrates a warning issued as a result of a detection operation according to an embodiment of the present invention.
Figure 5A:
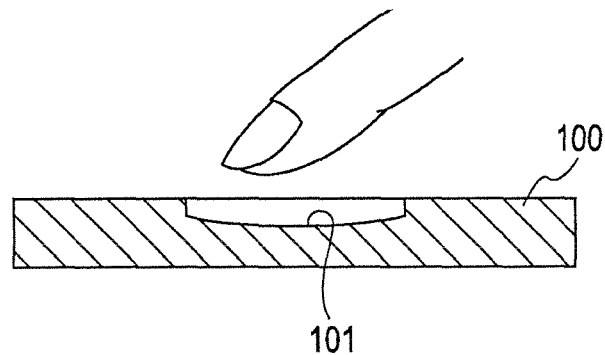
FIG. 5A illustrates a first basic structure of a touch sensor according to related art.
Figure 5B:
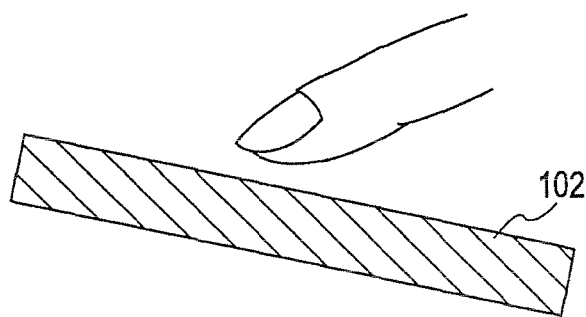
FIG. 5B is a second basic structure of a touch sensor according to related art.

FIG. 4 illustrates a warning issued as a result of the operation in step ST4.

It is assumed that an apparatus including the touch sensor 1 is provided with a speaker 20 for informing by sound, for example. The CPU in the sensor circuit 5 shown in FIG. 1A or a CPU totally controlling the apparatus controls a sound processing circuit, not shown in the figure, to play back a warning content stored, in advance, in a memory (for example, a ROM), etc., not shown in the figure. Thereby, the speaker 20 informs the operator of a predetermined warning content, such as "Please touch properly", for example. Thus, the operator is guided to retry a correct touch. The informing means may be other than the speaker 20, for example, display means of characters, etc.

3. Variation

In the above embodiment, the following various variations are possible.

The touch sensor is not limited to a capacitive type. The touch sensor may be, for example, a resistance type in which a change in resistance occurs for an internal resistor in accordance with the operation on the switch electrodes 4-1 and 4-2, and the dummy electrode 4-3. Thereby, it is possible to detect the operation. In this case, the surface of the switch electrodes 4-1 and 4-2, and the dummy electrode 4-3 should be covered with a soft protection material instead of the non-conductive panel 11, such as a hard glass, etc. Also, the switch electrodes 4-1 and 4-2, and the dummy electrode 4-3 should be operated by being pressed down individually. By this operation, pressure is applied on the resistor, causing a change in resistance. The sensor circuit 5 detects the change in resistance, and determines the validity of the operation on the switch electrodes 4-1 and 4-2 on the basis of the output (whether there is valid resistance) of the dummy electrode 4-3. The determination processing flow itself is the same as FIG. 3, and the pattern of the switch electrodes 4-1 and 4-2, and the dummy electrode 4-3 can be the same as the pattern in FIG. 1A.

Also, in a capacitive type, the dummy electrode 4-3 may be completely closed ring-shaped (FIG. 4) with using an appropriate material of the electrode or the other part, as may be necessary.

Also, the touch sensor 1 may be formed immediately under the uppermost surface of the glass panel in the image display panel. In this case, it is necessary to use a transparent electrode, such as ITO, etc., for the switch electrodes 4-1 and 4-2, and the dummy electrode 4-3. The control block 1B shown in FIG. 1B may be formed on another panel drive substrate.

The above embodiments including the variation are only examples of the case of detecting a touch level indicating a degree of touch in accordance with a change in the amount of capacitance or resistance. Here, as is apparent by a capacitive method, a touch is not only limited to a physical touch, but also includes an approach to a sensor section, which is recognized as a valid touch.

Accordingly, the present embodiment is not limited to what is described above, but includes various variations included in the following detection operations.

The sensor circuit 5 can detect a touch level indicating a degree of touch for each of the operation switches SW1, SW2, and the dummy switch SW3. Regarding a first touch level of the operation switches SW1, SW2 and a second touch level of the dummy switch SW3, there are the following cases (A) to (B). The sensor circuit 5 invalidates the detection of a touch on the operation switches SW1, SW2 in the cases (A) to (C), and validates the detection of a touch on the operation switches SW1, SW2 in the case (D).

(A) The first touch level and the second touch level are both within a specified range of a valid touch.

(B) The first touch level is out of the range specified by (A), and the second touch level is within a range specified by (A).

(C) The first touch level and the second touch level are both out of the range specified by (A).

(D) The first touch level is within the range specified by (A), and the second touch level is out of the range specified by (A).

In this manner, by determining whether a touch level is within a valid range, a determination is easily and correctly made on whether a touch is valid or invalid.

The dummy electrode 4-3 shown in FIG. 1A is shared for the two switch electrodes 4-1 and 4-2. However, the dummy electrode may be divided into two individually independent electrodes for the individual switch electrodes.

Furthermore, for one switch electrode, the dummy switch surrounding the switch electrode may be divided into a plurality of electrodes individually detecting a touch independently.

If a touch on all of the divided parts is detected, it is determined that "an object is placed" or "there is a touch by part of a human body having a large area". On the other hand, if a touch on a portion of the divided parts is detected, it is determined to be "miss-operation" or "a touch by part of a human body having a small area". Thus, it is possible to react differently, for example, by giving a warning with a content in accordance with the determination result. In this case, it is possible to distinguish an incident of "an object is placed", in particular, by taking a touch time into consideration.

In the above-described embodiment of the present invention, by thinking out the dispositions of switch electrodes, it is possible for the sensor circuit 5 to determine whether a touch is valid or invalid. At this time, whether a touch to the first touch sensor section (the operation switches SW1, SW2) is intentional or not is determined on the basis of the output of the second touch sensor section (the dummy switch SW3). Thus, in the case of an unintended touch by an object or part of a human body, the sensor circuit 5 can invalidate the output of the first touch sensor (the operation switches SW1, SW2) on the basis of the output of the second touch sensor section (the dummy switch SW3), and can validate only an intended touch. In the case of unintended touch, it is possible to call an operator's attention to perform correct operation by giving a warning.

By the disposition of the dummy electrode 4-3 with respect to the switch electrodes 4-1 and 4-2, the dummy electrode 4-3 easily detects an invalid operation.

Also, the touch sensor 1 has a configuration to be easily built in a display panel, etc.

In particular, in the capacitive touch sensor 1, since the sensor is capacitive, it is possible to determine a valid touch even in the case where a finger, etc., comes close to the sensor using the fact that an external capacitance held by a finger, etc., can be coupled with the capacitance of the sensor without contact. This enables the implementation of high-sensitive detection, and makes it easy to determine whether a detected touch is within a valid range or not.

It is therefore possible to provide an electric touch sensor which prevents a miss-operation caused by an unintended touch by an object or a person.

It should be understood by those skilled in the art that various modifications, combinations, sub-combinations and alterations may occur depending on design requirements and other factors insofar as they are within the scope of the appended claims or the equivalents thereof.

What is claimed is:

1. A touch sensor comprising:
   a first touch sensor section that detects an intentional touch and has a plurality of operation switches;
   a second touch sensor section that is disposed close to the first touch sensor section, substantially surrounds each of the plurality of the operation switches of the first touch sensor section, and detects an unintentional touch; and
   a sensor detection section for (1) detecting a touch level indicating a degree of touch on each of the first touch sensor section and the second touch sensor section, and (2) determining whether the degree of touch is within a predetermined range, and (3) determining whether a valid touch has been given to the first touch sensor section on the basis of whether the detected touch level of the second touch sensor section is within the predetermined range and on the basis of whether the detected touch level of the first touch sensor section is within the predetermined range,
   wherein the sensor detection section invalidates detection of a touch on the first touch sensor section in a first situation, a second situation and a third situation, and validates the detection of a touch on the first touch sensor section in a fourth situation,
   wherein the first situation occurs when a first touch level corresponding to a touch of the first touch sensor and a second touch level corresponding to a touch of the second touch sensor, are both within a specified range of a valid touch,
   wherein the second situation occurs when the first touch level is out of the range specified by the first situation and the second touch level is within a range specified by first situation,
   wherein the third situation occurs when the first touch level and the second touch level are both out of the range specified by the first situation, and
   wherein the fourth situation occurs when the first touch level is within the range specified by the first situation, and the second touch level is out of the range specified by the first situation.

2. The touch sensor according to claim 1,
   wherein when the sensor detection section detects a touch on the first touch sensor section, the sensor detection section validates the touch detection on the condition that the second touch sensor does not detect a valid touch, and when the sensor detection section detects a valid touch on the second touch sensor section, the sensor detection section invalidates the touch detection on the first touch sensor section.

3. The touch sensor according to claim 2,
   when a first touch level on the first touch sensor section and a second touch level on the second touch sensor section are both within a range regarded as valid, if the first touch level is out of the range and the second touch level is within the range, or if both the first touch level and the second touch level are out of the range, the sensor detection section invalidates the touch detection on the first touch sensor section, and if the first touch level is within the range and the second touch level is out of the range, the sensor detection section validates the touch detection on the first touch sensor section.

4. The touch sensor according to claim 3,
   wherein the first touch sensor section and the second touch sensor section are capacitive touch sensors changing capacitance by an approach or a touch of a human body or an object, and in accordance with an amount of change in capacitance of the first touch sensor section and an amount of change in capacitance of the second touch sensor section, the sensor detection section determines whether each of the two amounts of change in capacitance is within the range or out of the range.

5. The touch sensor according to claim 1,
   wherein the first touch sensor section and the second touch sensor section are capacitive touch sensors changing capacitance by an approach or a touch of a human body or an object.

6. The touch sensor according to claim 1,
   wherein an operation section of the second touch sensor section is disposed close to the periphery of an operation section of the first touch sensor section.

7. The touch sensor according to claim 6,
   wherein the first touch sensor section and the second touch sensor section are capacitive touch sensors changing capacitance by an approach or a touch of a human body or an object, and a second electrode corresponding to the operation section of the second touch sensor section is disposed close to the periphery of a first electrode corresponding to the operation section of the first touch sensor section.

* * * * *